United States Patent [19]

Dustmann et al.

[11] Patent Number: 4,585,696
[45] Date of Patent: Apr. 29, 1986

[54] SUPERCONDUCTING FIBER

[75] Inventors: Cord-Heinrich Dustmann, Weinheim; Georg Wahl, Eppelheim; Franz Schmaderer, Heidelberg; Erich Fitzer, Karlsruhe; Karl Brennfleck, Karlsruhe; Manfred Dietrich, Karlsruhe; Lienhard Paterok, Graben-Neudorf, all of Fed. Rep. of Germany

[73] Assignees: Brown, Boveri & Cie AG, Mannheim; Kernforschungszentrum Karlsruhe GmbH, Karlsruhe, both of Fed. Rep. of Germany

[21] Appl. No.: 614,332

[22] Filed: May 25, 1984

[30] Foreign Application Priority Data

May 28, 1983 [DE] Fed. Rep. of Germany ....... 3319524

[51] Int. Cl.⁴ .......................... D02G 3/00; B32B 9/00; H01B 5/00
[52] U.S. Cl. .................... 428/375; 428/366; 428/367; 428/368; 428/920; 427/62; 174/126 S; 174/128 S
[58] Field of Search ............... 428/366, 367, 368, 375, 428/920; 427/62, 308; 174/126 S, 128 S; 29/599

[56] References Cited

U.S. PATENT DOCUMENTS

| | | | |
|---|---|---|---|
| 3,897,542 | 7/1975 | Economy et al. | 427/399 |
| 4,299,861 | 11/1981 | Dietrich et al. | 427/62 |
| 4,373,006 | 6/1983 | Golasso et al. | 428/368 |
| 4,405,685 | 9/1983 | Honjo et al. | 428/368 |

Primary Examiner—George F. Lesmes
Assistant Examiner—Beverly K. Johnson
Attorney, Agent, or Firm—Herbert L. Lerner; Laurence A. Greenberg

[57] ABSTRACT

A superconducting fiber of a superconducting fiber bundle, in which a base layer of a carbide or oxide is applied to the outer surface of a carrier fiber and subsequently a superconducting layer is deposited on the base layer to which the superconducting layer adheres.

4 Claims, 2 Drawing Figures

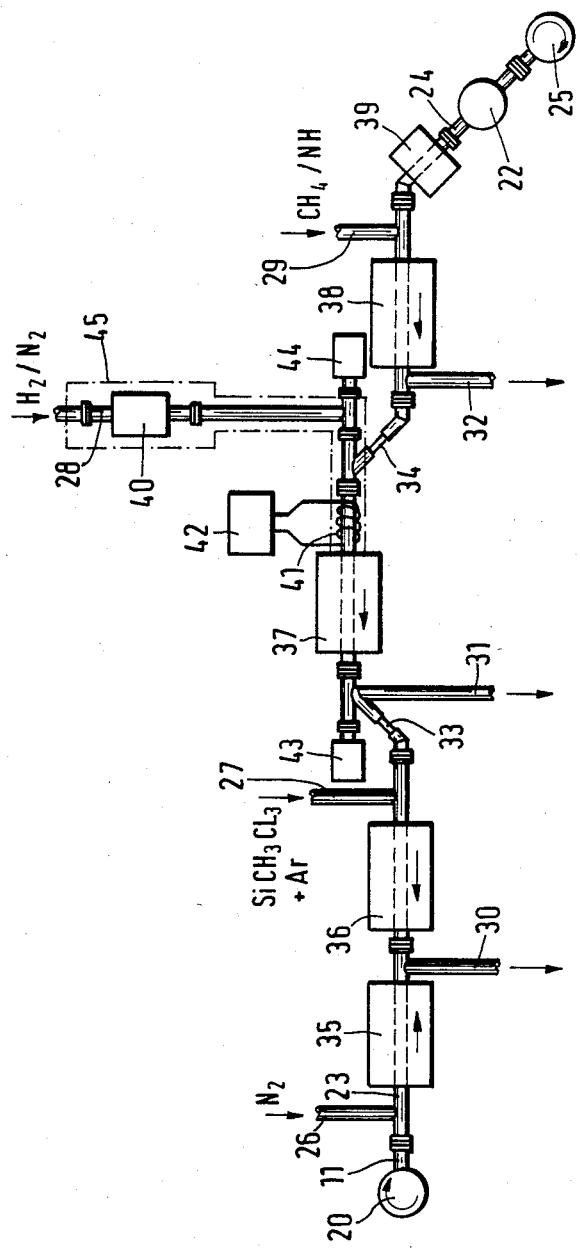

SUPERCONDUCTING FIBER

CROSS-REFERENCE TO RELATED APPLICATION

Application Ser. No. 518,381, filed July 29, 1983.

BACKGROUND OF THE INVENTION

1. Field of the Invention

The invention relates to a superconducting fiber of a superconducting fiber bundle, in which the outer surface of a carrier fiber is surrounded by a superconducting layer.

2. Description of the Prior Art

In the further development of energy technology, with a view to nuclear fusion and superconducting generators, transport technology (magnetic levitation train), environmental technology (coal desulfurization) and high-energy physics, high-field magnets are required which, due to economic aspects, can be produced only on the basis of superconductors.

Particularly for such applications, suitable carrier fibers (for example C, B or steel) having a high modulus of elasticity were coated with a superconducting material and combined into fiber bundles which contain any desired number of individual fibers. The carrier fibers serve as a matrix strong in tension and as a substrate for the application of the superconducting layer. Promising superconducting materials, for example niobium carbonitrides and niobium oxycaronitrides of the general formula $NbC_xN_yO_z$ ($x+y+z$ smaller than or equal to 1) have been disclosed. Niobium compounds of this type are distinguished by high critical temperatures, high critical magnetic fields and high critical current densities. They can be applied to the carrier fiber by a chemical vapor deposition process (VD) in which the niobium is deposited as a thin film by reaction of $NbCl_5$ with $H_2$ in the presence of carbon-containing and nitrogen-containing gases. The CVD process is here carried out either in a single stage (simultaneous deposition of Nb and carbonitriding) or in two stages (deposition of Nb and carbonitriding being carried out successively).

German Auslegeschrift No. 2,856,885 and the publication "Chemical Vapor Deposition of Superconducting Niobium carbonitride Films on Carbon Fibers", K. Brennfleck, M. Dietrich, E. Fitzer, D. Kehr, Proc. of CVD—7th International Conference, 300-314, The Electrochemical Society, Princeton, N. Y. (1979), have disclosed such a two-stage CVD process. Moreover, further improved processes which are suitable for the production of superconducting fiber bundles have been proposed in related application Ser. No. 518,381, and in the publication "CVD Processing of Carbon Fiber Superconductors", M. Dietrich, C. H. Dustmann, F. Schmaderer, G. Wahl, presented at the Applied Superconductivity Conference, 1982, Knoxville, Paper MB 2. Superconducting fiber bundles produced by these improved processes have a homogeneous coating of the individual fibers of the fiber bundle. Their superconducting layers are extremely fine-grained, so that high critical magnetic fields and high critical current densities were obtained.

In the production of superconducting fibers, however, it has been found that it is very difficult to achieve adequate adhesion of the superconducting layer to the carrier fiber. This problem arises more or less with every type of carrier fiber or type of superconductor. One reason for this is the different coefficients of thermal expansion of the carrier fiber and of the superconducting layer. Another cause is to be seen in the fact that, during the coating of the carrier fibers by the CVD process, reactive gases, such as hydrogen gas or ammonia, attack the fiber surface or form undesired hydrocarbon compounds on the fiber surface and make good adhesion of the superconducting layer more difficult.

The inadequate adhesion of the superconducting layer to the carrier fiber results in cracks in the superconducting layer and, under certain circumstances, causes it to peel off. This is a disadvantage, since interruptions in the superconducting layer by cracks or gaps entail a reduction of the critical current density of the superconducting fiber.

Application of the above-mentioned two-stage CVD process was able only partially to solve these problems in the case of carrier fibers consisting of carbon fibers of high tensile strength (HT carbon fibers). By contrast, satisfactory coating of high-modulus fibers (HM carbon fibers), that is to say carbon fibers with particularly high graphitization and consequently a high modulus of elasticity, has hitherto not been possible. HM carbon fibers are, however, distinguished by better mechanical compatibility with niobium carbonitride or niobium oxycarbonitride, as compared with HT carbon fibers, so that their use as the carrier fiber is particularly desirable.

SUMMARY OF THE INVENTION

It is an object of the invention to provide superconducting fibers of the type mentioned at the outset, and processes for the production thereof, wherein the adhesion of the superconductng layer to the carrier fiber is improved and which allow the use of high-modulus fibers.

With the foregoing and other objects in view, there is provided in accordance with the invention a superconducting fiber of a superconducting bundle comprising a carrier fiber, a base layer of a carbide covering the outer surface of the carrier fiber, and a superconducting layer adhering to the base layer and surrounding the outer surface of the carrier fiber.

In accordance with the invention, there is provided a superconducting fiber of a superconducting bundle comprising a carrier fiber, a base layer of a carbide covering the outer surface of the carrier fiber, and a superconducting layer adhering to the base layer and surrounding the outer surface of the carrier fiber.

There is provided a superconductive fiber comprising a carrier fiber, a base layer of an oxide covering the outer surface of the carrier fiber, and a superconducting layer adhering to the base layer and surrounding the outer surface of the carrier fiber.

In accordance with the invention, there is further provided a process for preparing a superconducting fiber which comprises depositing a base layer selected from the group consisting of a carbide and an oxide by chemical deposition from the vapor phase on a carrier fiber to cover the outer surface of the carrier fiber, and subsequently depositing a superconducting layer on the base layer adhering to the base layer and surrounding the outer surface of the carrier fiber.

Other features which are considered as characteristic for the invention are set forth in the appended claims.

Although the invention is illustrated and described herein as embodied in a superconducting fiber, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings in which:

FIG. 2 shows a CVD apparatus for the production of superconducting fibers according to the invention.

DETAILED DESCRIPTION OF THE INVENTION

Figure 1:
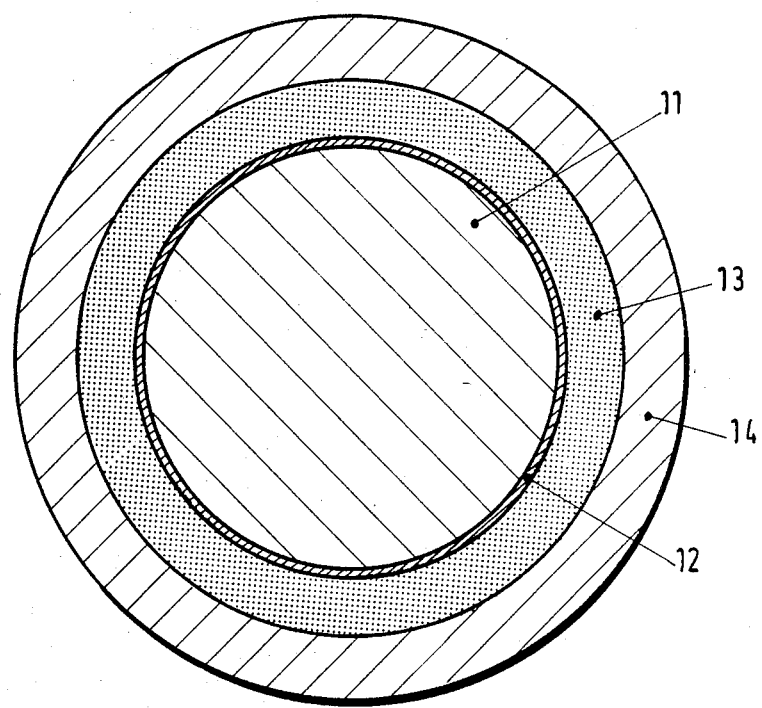
FIG. 1 shows a superconducting fiber according to the invention in cross-section.

According to the invention, adhesion of the superconducting layer is achieved when the outer surface of the carrier fiber is covered by a base layer of a carbide, to which the super-conducting layer adheres. The base layer consists preferably of silicon carbide SiC, tungsten carbide $W_2C$ or titanium carbide TiC. For example, SiC base layers are oxidation-resistance and withstand corrosive influences at elevated temperatures, so that a chemical attack on the carbon fiber during the coating with niobium carbonitride or niobium oxycarbonitride in the CVD process is diminished. Moreover, due to its favorable coefficient of thermal expansion, a SiC base layer reduces the stresses between the carbon fiber substrate and the superconducting layer.

In a further inventive achievement of the stated object, the outer surface of the carrier fiber is covered by a base layer of an oxide, to which the superconducting layer adheres. Advantageous oxides are aluminum oxide $Al_2O_3$ or zirconium dioxide $ZrO_2$.

The base layer should form, as far as possible, a closed layer which covers the carrier fiber. On the other hand, it should be as thin as possible.

To produce superconducting fibers, a chemical vapor-phase deposition process (CVD process) is used according to the invention, wherein bundles of carrier fibers are coated, and the carbide or oxide of the base layer, if appropriate subsequently to a purification treatment, is deposited on the carrier fibers. This is followed by a known single-stage or two-stage CVD process for depositing the superconducting layer. For example, niobium oxycarbonitride of the general formula $NbC_xN_yO_z$ ($x+y+z$ smaller than or equal to 1) is deposited on a carbon fiber bundle with the aid of chemical deposition from the vapor phase by reacting niobium chloride, carbon compounds and nitrogen compounds.

In the deposition of the base layer, it is advantageous to use a gas mixture, which contains a chloride or oxide, as a reaction gas. Examples of suitable reaction gases are methylsilicon trichloride $CH_3SiCl_3$ or gas mixtures of titanium tetrachloride, tungsten hexachloride or aluminum trichloride with methane.

The invention and further advantageous embodiments and further developments will be explained and described in more detail by reference to the drawing in which an illustrative embodiment of the invention and equipment for carrying out the production process are represented.

The greatly enlarged, diagrammatic representation of the cross-section of a superconducting fiber according to the invention, in accordance with FIG. 1, shows a carbon fiber 11 which serves as the carrier fiber and to which various, concentrically arranged layers have been applied. The diameter of the carbon fiber 11 is, for example, 7 micrometers. A base layer 12 of silicon catrbide SiC having a layer thickness of between 30 and 80 nm (preferably 40 to 50 nm) has been applied to the carbon fiber 11. The base layer 12, in turn, carries a superconducting layer 13 which consists of a niobium carbonitride Nb(C,N) or a niobium oxycarbonitride $NbC_xN_yO_z$ and can have layer thicknesses of between 100 and 1000 nm. The superconducting layer 13 is covered by a shell 14 of high-purity copper or aluminum, the layer thickness of which can be about 1000 nm. This shell 14 serves for electrical stabilization of the superconducting fiber and, in the normally conducting state of the fiber, carries the electric current.

FIG. 2 shows a deposition apparatus, by means of which a superconducting fiber bundle can be produced from a large number of individual fibers according to the invention by applying a base layer 12 to carbon fibers and subsequently depositing niobium oxycarbonitride and coppering the individual fibers.

A raw material roll with uncoated carrier fibers 11 (carbon fiber bundle) is located in an unwinding chamber 20. The carrier fibers 11 are drawn by a fiber transport device 22 through a quartz tube 23 which has several angles and in which the coating of the carrier fibers 11 takes place. The coated fibers 24 are wound up on a receiving roll located in a winding-up chamber 25. In the quartz tube 23, four gas inlet branches 26, 27, 28 and 29 are provided, through which nitrogen $N_2$, a mixture of argon Ar (which is used as a carrier gas) and methylsilicon trichloride $CH_3SiCl_3$, a mixture of hydrogen and nitrogen $H_2/N_2$ and a mixture of methane and ammonia $CH_4/NH_3$, respectively, can be introduced into the quartz tube 23. The gas present within the quartz tube 23 can be pumped out via three pump branches 30, 31 and 32 and a vacuum produced in tube 23. Balancing of the pressure in the quartz tube 23 is prevented by means of two restriction points 33 and 34, through which the fiber can be drawn, but flow of gas is impeded at points 33 and 34, so that different pressures can in each case be established within the quartz tube 23 upstream and downstream of the restriction points 33 and 34. Mixing of the different gases is thereby avoided.

While being transported from the unwinding chamber 20 to the winding-up chamber 25, the fiber bundle passes through five ovens 35, 36, 37, 38 and 39. The carbon fibers 11 are purified in the first oven 35, if necessary, by being heated in a nitrogen or hydrogen atmosphere. The gas feed rate into the gas inlet branch 26 is, for example, between 1 and 20 liters per hour. The oven temperature is set to 600° to 1,000° C.

In the second oven 36, an interlay is applied according to the invention by means of depositing silicon carbide SiC from the vapor phase of methylsilicon trichloride $CH_3SiCl_3$. Methylsilicon trichloride flows through the gas inlet branch 27 into the quartz tube 23 and decomposes in the oven 36 into silicon carbide SiC and hydrogen chloride HCl at a partial pressure of about 50 mbar and a temperature of between 1000° and 1100° C. The silicon carbide deposits uniformly on the purified carbon fiber surface. The spent gas is pumped out via pump branch 30, the gas pressure of the gas mixture of argon and methylsilicon trichloride being adjusted to about 1000 mbar.

In the third oven 37, the fibers are coated with an Nb-containing compound from an $NbCl_5/H_2/N_2$ gas mixture. For this purpose, a hydrogen/nitrogen mixture flows through the gas inlet branch 28 into the quartz tube 12 at a feed rate which is between 2 and 20 liters per hour. The NbCl$_5$ is transferred into the gas phase from a solids vaporizer 40, which can also be replaced, however, by a liquid-phase vaporizer, and is passed into the reactor together with the hydrogen/nitrogen mixture. The temperature of the solids vaporizer is here set to a value between 80° and 200° C. However, the niobium chloride can also be produced by direct chlorination of niobium. The temperature of the oven 37 is between 600° and 1000° C. The residual gas is pumped out via the pump branch 31.

The second stage of the CVD process, for producing the superconducting layer, takes place in the fourth oven 38. A carbon-containing and nitrogen-containing gas mixture (for example 0 to 50% by volume of methane and 0 to 50% by volume of ammonia, the remainder being nitrogen) is introduced through the gas inlet branch 29 into the quartz tube 23. The feed rates of methane and ammonia are each between 2 and 15 liters per hour. The fourth oven 38 is at a controlled temperature of between 700° and 1100° C. At this temperature, the methane and ammonia gases dissociate, and carbon and nitrogen penetrate into the niobium layer. The residual gas is extracted via the pump branch 32.

Single-stage operation in the deposition apparatus can also be carried out, that is to say niobium is deposited and simultaneously carbonitrided in a carbon-containing and nitrogen-containing atmosphere in the oven 37.

The quartz tube 23 (reactor) and the gas supply are constructed, by means of suitably fitted flow resistances (restriction points 33 and 34) and pumps, which are connected to the pump branches 30, 31 and 32, so that the gases in the ovens 35, 36, 37 and 38 always flow in the direction of the arrow.

The deposition of niobium in the oven 37 takes place with plasma activation. For this purpose, a high-frequency (HF) coil 41 is provided upstream of the oven 37 (in accordance with the direction of gas flow in the quartz tube). The HF coil 41 is fed by an HF generator 42 with a frequency of 13.65 MHz. The power of the HF generator 42 is, for example, between 5 and 100 watts. The coil 41 has, for example, a length of 80 mm and a diameter of 55 mm, and carries 13 windings. The plasma activation can also be effected—this is not shown—capacitively or by means of a direct current discharge. For this purpose, there are two radially opposite metal rods or plates as electrodes in the quartz tube 23. The reactants (gases) within the quartz tube 23 are brought into an excited or ionized state by means of the HF coil or the electrodes respectively. The gas discharge can be excited in a continuous or pulsating manner.

The deposition of niobium in the oven 37 can also take place under the action of an ultrasonic field. The ultrasonic field can, for example, be generated by a Piezo crystal 43 and reflected on a sound reflector 44.

The quartz tube section between the solids vaporizer 40 and the oven 37 is advantageously thermo-stabilized in order to maintain the gas temperature. This is indicated by a dot-and-dash line 45.

In the oven 39, the superconducting layers of the fiber bundle are coated with a highly conductive copper layer 14. This is effected by a CVD process, in which copperos deposited from the vapor phase onto the fibers. The temperature of the oven 39 can be controlled that the fibers are colder than the copper which is to be deposited.

The foregoing is a description corresponding, in substance, to German application No. P33 19 524.2, dated May 28, 1983, international priority of which is being claimed for the instant application, and which is hereby made part of this application. Any material discrepancies between the foregoing specification and the specification of the aforementioned corresponding German application are to be resolved in favor of the latter.

There is claimed:

1. A superconducting fiber comprising a carrier fiber selected from the group consisting of steel, carbon and boron, a base layer of a carbide covering the outer surface of the carrier fiber, and a superconducting layer comprising a niobium-containing compound adhering to the base layer and surrounding the outer surface of the carrier fiber.

2. A superconducting fiber according to claim 1, wherein the base layer is silicon carbide (SiC).

3. A superconducting fiber according to claim 1, wherein the base layer is tungsten carbide (W$_2$C).

4. A superconducting fiber according to claim 1, wherein the base layer is titanium carbide (TiC).

* * * * *